(12) United States Patent
Daniel

(10) Patent No.: US 7,180,371 B2
(45) Date of Patent: Feb. 20, 2007

(54) INPUT AMPLIFIER WITH IMPROVED POWER SUPPLY REJECTION

(75) Inventor: Detlef Daniel, Hayward, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 87 days.

(21) Appl. No.: 11/079,759

(22) Filed: Mar. 14, 2005

(65) Prior Publication Data

US 2006/0202762 A1    Sep. 14, 2006

(51) Int. Cl.
*H03F 3/45* (2006.01)
(52) U.S. Cl. .................. 330/261; 330/252; 330/257
(58) Field of Classification Search ................ 330/261, 330/252, 257
See application file for complete search history.

(56) References Cited

U.S. PATENT DOCUMENTS

| | | | | |
|---|---|---|---|---|
| 4,658,219 A | * | 4/1987 | Saari | 330/253 |
| 5,420,540 A | * | 5/1995 | Butler | 330/255 |
| 5,838,807 A | * | 11/1998 | Andersson et al. | 381/321 |
| 6,154,092 A | * | 11/2000 | Lee et al. | 330/51 |
| 6,822,513 B1 | * | 11/2004 | Li et al. | 330/253 |
| 6,924,702 B2 | * | 8/2005 | Chen | 330/253 |

OTHER PUBLICATIONS

B. G. Song, et al., "A 1.8V Self-Biased Complementary Folded Cascode Amplifier"; AP-ASIC Proceedings 1999; http://www.ap-asic.org/1999/proceedings/session.html.

* cited by examiner

*Primary Examiner*—Patricia Nguyen

(57) ABSTRACT

An input amplifier for power amplifier control circuitry includes an input, an output, a power supply voltage, a ground, a differential amplifier and a double folded cascode and conversion stage. The differential amplifier is connected to the input, to the power supply voltage and to the ground. The differential amplifier provides a differential output. The double folded cascode and conversion stage is connected to the differential amplifier, to the ground and to the power supply voltage. The double folded cascode and conversion stage converts the differential output to a single-ended signal. The double folded cascode and conversion stage is optimized to prevent variation in the power supply voltage from propagating to the output.

13 Claims, 4 Drawing Sheets

INPUT AMPLIFIER WITH IMPROVED POWER SUPPLY REJECTION

BACKGROUND

Power-amplifier control circuits are used to regulate the output power of an amplifier, such as those used in mobile phones. These amplifiers can be subject to extreme operating conditions, such as a widely varying power supply voltage. A closed-loop feedback controller, that senses the output power and compares it with a reference, is typically added to a power amplifier to stabilize its output level. In this arrangement an input amplifier is used at the input as interface for the input control voltage. The input amplifier conditions the internal reference voltage for the error or loop amplifier in terms of voltage level, polarity and gain. The input amplifier and the power-amplifier usually share the same single voltage supply.

In the prior art, the input amplifier has been implemented using low input rail amplifier topology. However, in a standard, low input rail amplifier topology, power supply leakage can occur in the differential-to-single-ended conversion stage at the output of the input amplifier. There is a need, therefore, to improve power supply rejection to maintain a stable reference voltage, and thereby achieve near supply voltage independent, accurate power regulation.

SUMMARY OF THE INVENTION

In accordance with an embodiment of the present invention, an input amplifier for power amplifier control circuitry includes an input, an output, a power supply voltage, a ground, a differential amplifier and a double folded cascode and conversion stage. The differential amplifier is connected to the input, to the power supply voltage and to the ground. The differential amplifier provides a differential output. The double folded cascode and conversion stage is connected to the differential amplifier, to the ground and to the power supply voltage. The double folded cascode and conversion stage converts the differential output to a single-ended signal. The double folded cascode and conversion stage is optimized to prevent variation in the power supply voltage from propagating to the output.

DESCRIPTION OF THE EMBODIMENT

Figure 1:
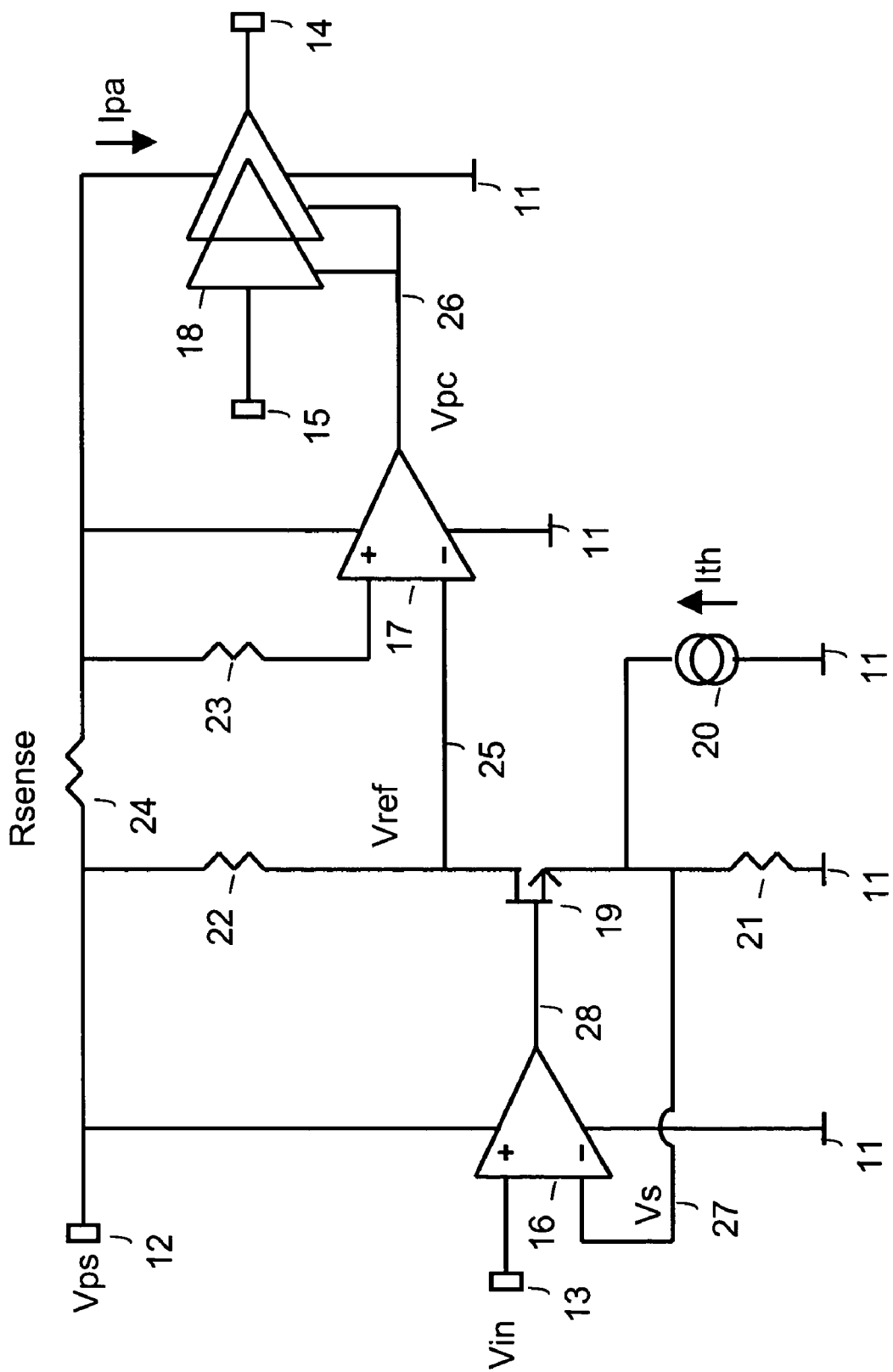
FIG. 1 shows a schematic for a power amplifier module.

FIG. 1 shows a power amplifier module that includes control circuitry for a power amplifier 18. Power amplifier 18 exhibits an I²pa current to output power relation, where the square of the DC current of power amplifier 18 is proportional to the output power of power amplifier 18. Power amplifier 18 receives an input signal on an input 15 and generates an amplified output signal on an output 14. Current (Ipa) through power amplifier 18 is monitored by a current sense resistor 24 having a resistance value (Rsense). An error amplifier 17 provides a feedback control voltage (Vpc) to a control voltage input 26 of power amplifier 18. A reference voltage (Vref) is located at a negative input 25 of error amplifier 17.

An input control signal (Vin) is connected to a positive input 13 of input amplifier 16. An output 28 of input amplifier 16 is connected to the gate of a transistor 19. For example, transistor 19 is an NMOS field effect transistor. The source of transistor 19 is fed back to a negative input 27 of input amplifier 16, thereby closing the loop of input amplifier 16. An input threshold voltage is generated by means of a constant current (Ith) source 20 together with a resistor 21. The input threshold voltage is used to block offset voltages associated with the input control signal (Vin) at positive input 13 of input amplifier 16. Above the input threshold voltage, input amplifier 16 functions as a unity gain amplifier with regard to the NMOS source voltage (Vs) located at negative input 27 of input amplifier 16 and the input control signal (Vin) located at positive input 13 of input amplifier 16. The reference voltage (Vref) is a function of the NMOS source voltage (Vs) and the resistive divider formed by a resistor 22 and resistor 21 connected between a power supply voltage (Vps) 12 and a ground 11. The reference voltage (Vref) is referenced to the power supply voltage (Vps) and becomes more negative as the input control signal (Vin) becomes more positive. A resistor 23 along with resistor 22 provide offset cancellation for error amplifier 17.

Error amplifier 17 will adjust current (Ipa) through power amplifier 18 by means of feedback control voltage (Vpc), until the fed back quantity −Ipa* Rsense is approximately equal to Vref. One of the challenges of the control circuitry shown in FIG. 1 is the power supply dependence of Vref. It is important, therefore, to design input amplifier 16 to address this shortcoming.

Figure 2:
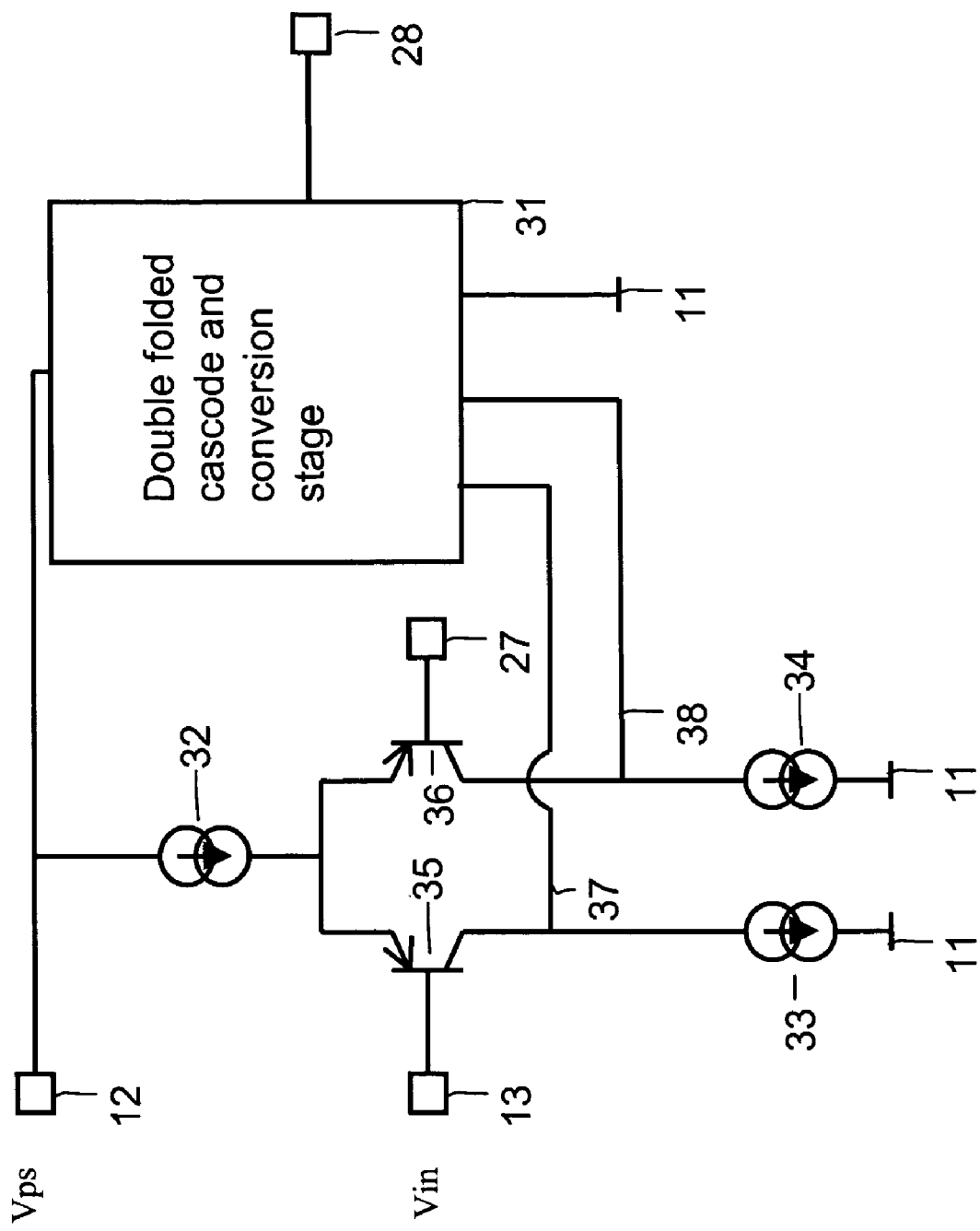
FIG. 2 shows an implementation for an input amplifier of the power amplifier control circuit shown in FIG. 1 in accordance with an embodiment of the present invention.

FIG. 2 shows an implementation for input amplifier 16. Input amplifier 16 includes a differential amplifier, represented in FIG. 2 by a current source 32, a current source 33, a current source 34, a transistor 35 and a transistor 36 connected as shown between power supply voltage 12 and ground 11. Positive input 13 is located at the base of transistor 35. Negative input 27 is located at the base of transistor 36. A double folded cascode and conversion stage 31 is connected to power supply voltage 12, is connected to current source 33 at a location 37 and is connected to current source 34 at a location 38. Double folded cascode and conversion stage 31 provides differential to single-ended conversion while blocking power supply variations from passing to output 28 of input amplifier 16.

Figure 3:
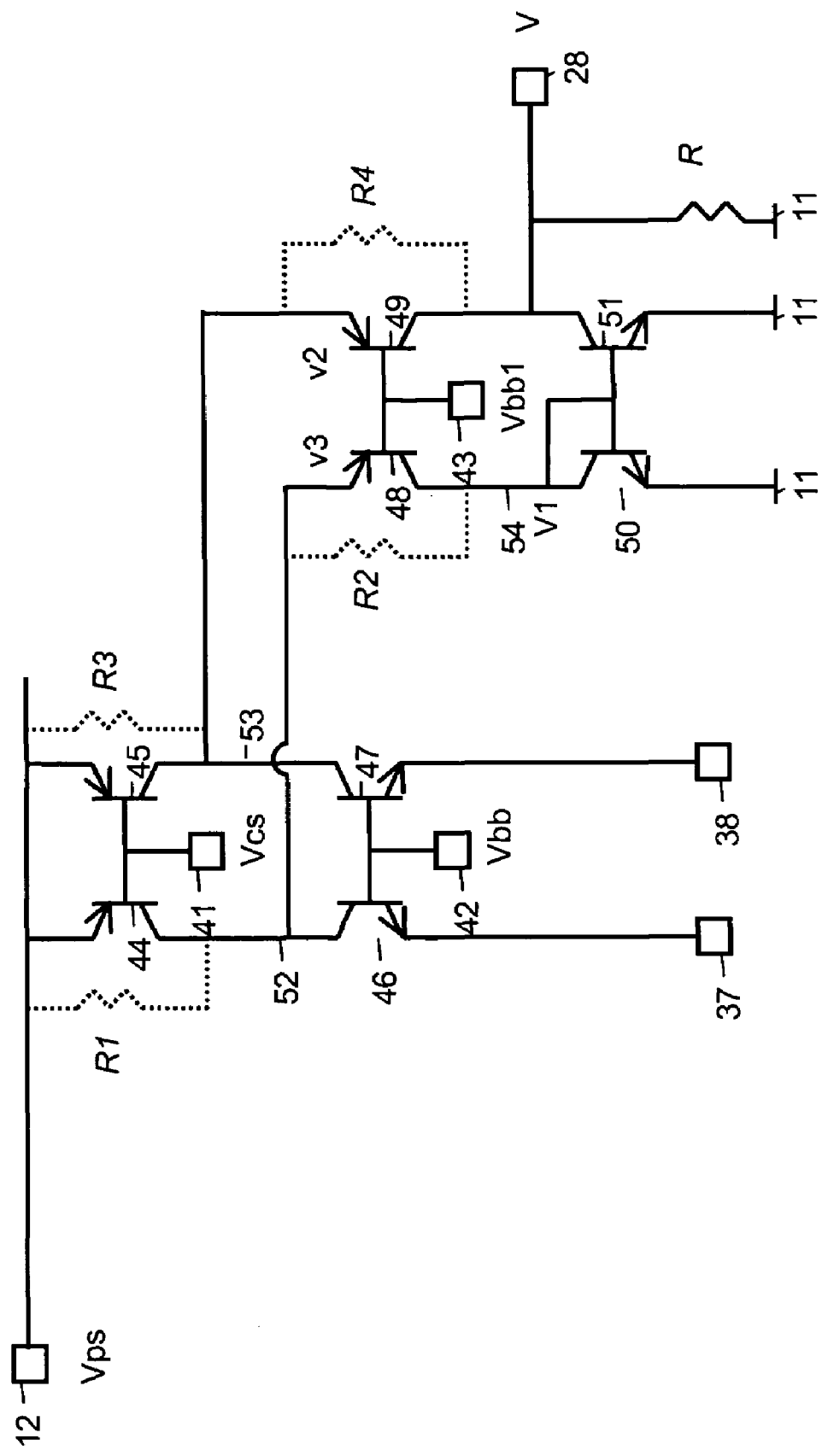
FIG. 3 shows an implementation of a double folded cascode and conversion stage within the input amplifier shown in FIG. 2 in accordance with an embodiment of the present invention.

FIG. 3 shows an implementation of double folded cascode and conversion stage 31. A transistor 44, a transistor 45, a transistor 46 and a transistor 47, connected as shown. A current source bias voltage (Vcs) at location 41 is used as the base voltage for transistor 44 and transistor 45, as shown. A base bias voltage (Vbb) at a location 42 is used as the base voltage for transistor 46 and transistor 47, as shown.

A transistor 48, a transistor 49, a transistor 50 and a transistor 51, connected as shown. A base bias voltage (Vbb1) at a location 43 is used as the base voltage for transistor 48 and transistor 49, as shown. A voltage (V1) at location 54 is used as the base voltage for transistor 50 and transistor 51, as shown. For example, transistor 44, transistor 45, transistor 46, transistor 47, transistor 48, transistor 49, transistor 50 and transistor 51 are shown implemented as bipolar transistors.

In double folded cascode and conversion stage 31, the outputs from the differential amplifier are folded at a location 52 and a location 53 shown in FIG. 3. The fold at location 52 and location 53 is in addition to a fold at location 37 and location 38 shown in FIG. 2. The fold at location 52 and location 53 occurs because transistor 44 and transistor 45 each operate as a current source. As is clear from the discussion below, the additional fold located at location 52 and 53 results in blocking an error voltage due to the Early effect and variation in power supply voltage (Vps) 12

To aid in analysis of the circuit, a resistance R1 represents the Early effect of pnp transistor 44, a resistance R3 represents the Early effect of pnp transistor 45, a resistance R2 represents the Early effect of pnp transistor 48, a resistance R4 represents the Early effect of pnp transistor 49. The Early effect of npn transistors 46, 47, 50 and 51 are ignored because the Early effect is less pronounced with npn transistors. A resistance R represents the load resistance of the output convergence stage at output 28.

Figure 4:
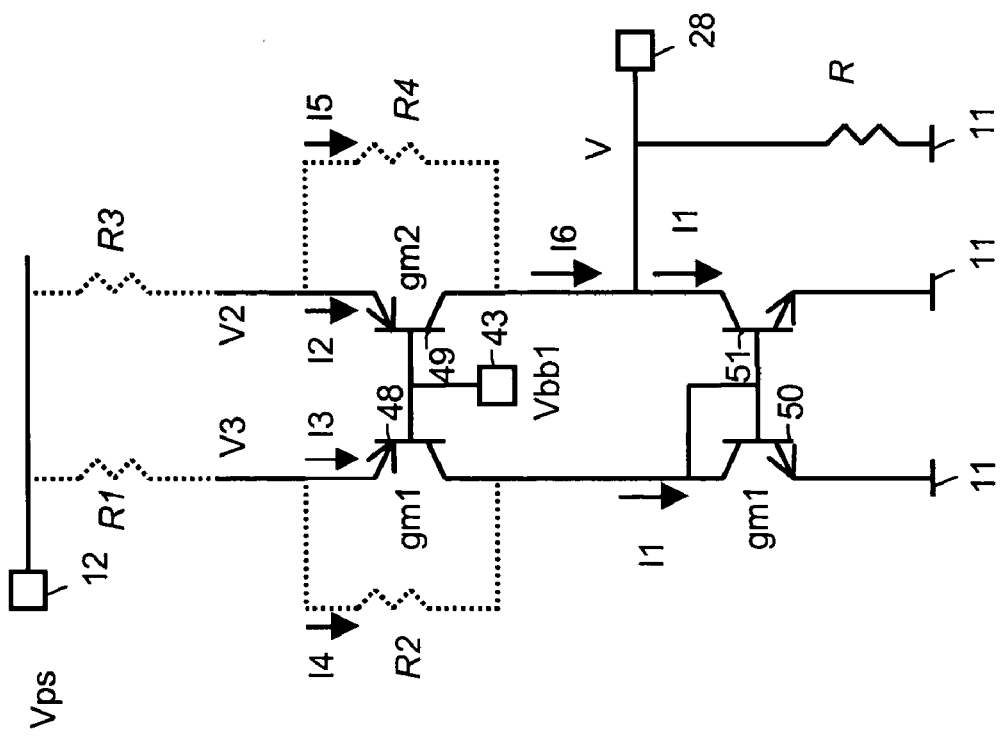
FIG. 4 shows a diagram used for analysis of power supply rejection in accordance with an embodiment of the present invention.

FIG. 4 shows a diagram used for analysis of power supply rejection through double folded cascode and conversion stage 31. Just components essential for analysis are shown. For the analysis, resistance value R1, resistance value R2, resistance value R3, resistance value R4, resistance value R, voltage value V, voltage value V2, voltage value V3, voltage value Vbb1, current value I1, current value I2, current value I3, current value I4, current value I5 and current value I6 are labeled for reference. The transconductance of transistor 48 and the transconductance of transistor 50 are equal and represented by a transconductance value gm1. The transconductance of transistor 49 is represented by a transconductance value gm2.

In the discussion below, a linear small signal analysis is performed. To indicate the analysis ignores DC voltages and DC currents, small case letters are used to represent AC voltage components (v) and AC current components (i).

For a linear small signal analysis, Equations 1 can be obtained from FIG. 4.

$$i3 = v3 * gm1$$
$$v3 = i4 * R2 + \frac{i1}{gm1}$$
$$i1 = i3 + i4$$
$$vps - v3 = i1 * R1$$

Equations 1

Rearranging and substituting in Equations 1 results in Equation 2 below:

$$\frac{i1}{vps} = \frac{gm1}{1 + gm1 * R1}$$

Equation 2

Equation 2 can also be expressed as in Equation 3 below:

$$i1 = Gm * vps$$

Equation 3 where $$Gm = \frac{gm1}{1 + gm1 * R1}.$$

As can be seen from Equation 3, i1 is independent of R2. This indicates the Early effect of the common base transistor is removed.

From the relations shown in FIG. 4, Equations 4 can be obtained:

$$i6 = i2 + i5$$
$$vps - v2 = i6 * R3$$
$$i2 = gm2 * v2$$
$$v2 = i5 * R4 + v$$
$$v = (i6 - i1) * R$$

Equation 4

Rearranging and solving for v/vps, the transfer function can be obtained, as set out in Equation 5 below:

$$\frac{v}{vps} = R * \frac{1 + gm2 * R4 - R4 * Gm - \frac{R1 * Gm * (1 + gm2 * R4)}{R + R4 + R2 * (1 + gm2 * R4)}}$$

Equation 5

With the assumption that for 1/gm1<<1/R1, Gm=1/R1, Equation 5 can be reduced to Equation 6 below:

$$\frac{v}{vps} = R * \frac{-\frac{R4}{R1}}{R + R4 + R2 * (1 + gm2 * R4)}.$$

Equation 6

In Equation 6, the term R2*(1+gm2*R4) in the denominator accounts for the additional power supply rejection from double folding. The total closed loop power supply transfer function referred to Vref becomes as set out in Equation 7 below:

$$\frac{vref}{vps} = \frac{R5}{R6} * \frac{R}{1 + gm * R} * \frac{-\frac{R4}{R1}}{R + R4 + R2 * (1 + gm2 * R4)}$$

Equation 7

As can be seen from Equation 7, the addition of double folded cascode results in excellent power supply rejection without use of a voltage regulator. Dynamic performance of input amplifier 16 is not compromised. This overcomes the problem of poor Early voltage if lateral pnp transistors are used within input amplifier 16. The disclosed topology lends itself to monolithic integration in, for example, either CMOS or bipolar technology.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. An input amplifier for power amplifier control circuitry comprising:
   an input;
   an output;
   a power supply voltage;
   a ground;

a differential amplifier connected to the input, to the power supply voltage and to the ground, the differential amplifier providing a differential output; and, a double folded cascode and conversion stage connected to the differential amplifier, to the ground and to the power supply voltage, the double folded cascode and conversion stage converting the differential output to a single-ended signal, the double folded cascode and conversion stage being optimized to prevent variation in the power supply voltage from propagating to the output, wherein the double folded cascode and conversion stage includes:
 a first current source connected to the power supply voltage;
 a second current source connected to the power supply voltage;
 a first transistor connected to the first current source and to a first differential output of the differential amplifier;
 a second transistor connected to the second current source and to a second differential output of the differential amplifier;
 a third transistor connected to the first current source;
 a fourth transistor connected to the second current source and to the output;
 a fifth transistor connected to the third transistor and to the ground; and,
 a sixth transistor connected to the output and to the ground.

2. An input amplifier as in claim 1:
wherein the first current source is a first bipolar transistor having an emitter connected to the power supply voltage, having a collector connected to the first transistor and having a base connected to a current source bias voltage; and,
wherein the second current source is a second bipolar transistor having an emitter connected to the power supply voltage, having a collector connected to the second transistor and having a base connected to the current source bias voltage.

3. An input amplifier as in claim 1:
wherein the first transistor is a first bipolar transistor having a collector connected to the first current source, having an emitter connected to the first differential output and having a base connected to a first base bias voltage;
wherein the second transistor is a second bipolar transistor having a collector connected to the second current source, having an emitter connected to the second differential output and having a base connected to the first base bias voltage;
wherein the third transistor is a third bipolar transistor having an emitter connected to the collector of the first transistor, having a collector and having a base connected to a second base bias voltage;
wherein the fourth transistor is a fourth bipolar transistor having an emitter connected to the collector of the second transistor, having a collector connected to the output and having a base connected to the second base bias voltage;
wherein the fifth transistor is a fifth bipolar transistor having a collector connected to the collector of the third transistor, having an emitter connected to the ground and having a base connected to the collector of the fifth transistor and,
wherein the sixth transistor is a sixth bipolar transistor having a collector connected to the collector of the fourth transistor, having an emitter connected to the ground and having a base connected to the collector of the fifth transistor.

4. An input amplifier as in claim 3
wherein the first current source is a seventh bipolar transistor having an emitter connected to the power supply voltage, having a collector connected to the collector of the first transistor and having a base connected to a current source bias voltage; and,
wherein the second current source is an eighth bipolar transistor having an emitter connected to the power supply voltage, having a collector connected to the collector of the second transistor and having a base connected to the current source bias voltage.

5. An input amplifier as in claim 4 wherein the differential amplifier includes:
 a third current source connected to the power supply voltage;
 a ninth bipolar transistor having an emitter connected to the third current source, having a collector providing the first differential output, and having a base connected to a positive component of the input;
 a tenth bipolar transistor having an emitter connected to the third current source, having a collector providing the second differential output, and having a base connected to a negative component of the input;
 a fourth current source connected to the collector of the ninth bipolar transistor and to the ground; and,
 a fifth current source connected to the collector of the tenth bipolar transistor and to the ground.

6. A power amplifier module comprising:
a power supply voltage;
a ground;
a power amplifier;
a feedback amplifier circuit connected to the power amplifier;
an input voltage conditioning circuit, the input voltage conditioning circuit including an input amplifier, wherein the input amplifier includes:
 an input,
 an output;
 a differential amplifier connected to the input, to the power supply voltage and to the ground, the differential amplifier providing a differential output, and
 a double folded cascode and conversion stage connected to the differential amplifier, to the ground and to the power supply voltage, the double folded cascode and conversion stage converting the differential output to a single-ended signal, the double folded cascade and conversion stage being optimized to prevent variation in the power supply voltage from propagating to the output, wherein the double folded cascode and conversion stage includes:
  a first current source connected to the power supply voltage;
  a second current source connected to the power supply voltage;
  a first transistor connected to the first current source and a first differential output of the differential amplifier;
  a second transistor connected to the second current source and a second differential output of the differential amplifier;
  a third transistor connected to the first current source;
  a fourth transistor connected to the second current source and to the output;

a fifth transistor connected to the third transistor and to the ground; and, a sixth transistor connected to the output and to the ground.

7. A power amplifier module as in claim 6:

wherein the first current source is a first bipolar transistor having an emitter connected to the power supply voltage, having a collector connected to the first transistor and having a base connected to a current source bias voltage; and, wherein the second current source is a second bipolar transistor having an emitter connected to the power supply voltages having a collector connected to the second transistor and having a base connected to the current source bias voltage.

8. A power amplifier module as in claim 6:

wherein the first transistor is a first bipolar transistor having a collector connected to the first current source, having an emitter connected to the first differential output and having a base connected to a first base bias voltage;

wherein the second transistor is a second bipolar transistor having a collector connected to the second current source, having an emitter connected to the second differential output and having a base connected to the first base bias voltage;

wherein the third transistor is a third bipolar transistor having an emitter connected to the collector of the first transistor, having a collector and having a base connected to a second base bias voltage;

wherein the fourth transistor is a fourth bipolar transistor having an emitter connected to the collector of the second transistor, having a collector connected to the output and having a base connected to the second base bias voltage;

wherein the fifth transistor is a fifth bipolar transistor having a collector connected to the collector of the third transistor, having an emitter connected to the ground and having a base connected to the collector of the fifth transistor; and, wherein the sixth transistor is a sixth bipolar transistor having a collector connected to the collector of the fourth transistor, having an emitter connected to the ground and having a base connected to the collector of the fifth transistor.

9. A power amplifier module as in claim 8:

wherein the first current source is a seventh bipolar transistor having an emitter connected to the power supply voltage, having a collector connected to the collector of the first transistor and having a base connected to a current source bias voltage; and, wherein the second current source is an eighth bipolar transistor having an emitter connected to the power supply voltage, having a collector connected to the collector of the second transistor and having a base connected to the current source bias voltage.

10. A power amplifier module as in claim 9 wherein the differential amplifier includes:

a third current source connected to the power supply voltage;

a ninth bipolar transistor having an emitter connected to the third current source, having a collector providing the first differential output, and having a base connected to a positive component of the input;

a tenth bipolar transistor having an emitter connected to the third current source, having a collector providing the second differential output, and having a base connected to a negative component of the input;

a fourth current source connected to the collector of the ninth bipolar transistor and to the ground; and, a fifth current source connected to the collector of the tenth bipolar transistor and to the ground.

11. A power amplifier module as in claim 10 wherein the feedback amplifier circuit includes:

a current sensor resistor connected between the power supply voltage and a current input to the power amplifier;

a first resistor having a first end connected to the current input to the power amplifier and having a second end; and, a feedback amplifier having a positive input connected to the second end of the first resistor, having a negative input connected to the input voltage conditioning circuit and having an output connected to a control input of the power amplifier.

12. A power amplifier module as in claim 10 wherein the input voltage conditioning circuit additionally includes:

a first voltage divider resistor having a first end connected to the power supply voltage;

a second voltage divider resistor having a first end connected to the ground;

a field effect transistor having a drain connected to a second end of the first voltage divider resistor, having a source connected to a second end of the second voltage divider resistor and to the negative component of the input of the input amplifier and having a gate connected to the output of the input amplifier; and, a threshold voltage source connected between the ground and the source of the field effect transistor.

13. A power module circuit as in claim 12 wherein the feedback amplifier circuit includes:

a current sensor resistor connected between the power supply voltage and a current input to the power amplifier;

a first resistor having a first end connected to the current input to the power amplifier and having a second end; and, a feedback amplifier having a positive input connected to the second end of the first resistor, having a negative input connected to the drain of the field effect transistor and having an output connected to a control input of the power amplifier.

* * * * *